(12) United States Patent
Kong et al.

(10) Patent No.: US 11,075,253 B2
(45) Date of Patent: Jul. 27, 2021

(54) ORGANIC LIGHT-EMITTING DISPLAY DEVICE

(71) Applicant: LG Display Co., Ltd., Seoul (KR)

(72) Inventors: In-Yeong Kong, Seoul (KR); Jong-Sin Park, Seoul (KR); Dong-Yoon Lee, Seoul (KR)

(73) Assignee: LG DISPLAY CO., LTD., Seoul (KR)

( * ) Notice: Subject to any disclaimer, the term of this patent is extended or adjusted under 35 U.S.C. 154(b) by 117 days.

(21) Appl. No.: 16/196,903

(22) Filed: Nov. 20, 2018

(65) Prior Publication Data

US 2019/0165065 A1 May 30, 2019

(30) Foreign Application Priority Data

Nov. 30, 2017 (KR) .................. 10-2017-0163237

(51) Int. Cl.
*G09G 3/3208* (2016.01)
*H01L 27/32* (2006.01)
*H01L 51/52* (2006.01)
*G09G 3/3225* (2016.01)

(52) U.S. Cl.
CPC ....... *H01L 27/3246* (2013.01); *G09G 3/3225* (2013.01); *H01L 27/322* (2013.01); *H01L 27/3272* (2013.01); *H01L 51/5206* (2013.01); *H01L 27/3211* (2013.01)

(58) Field of Classification Search
CPC ............. H01L 27/3211; H01L 27/3246; H01L 27/3209; G09G 3/30; G09G 3/3208; G09G 3/3225
See application file for complete search history.

(56) References Cited

U.S. PATENT DOCUMENTS

| | | | |
|---|---|---|---|
| 2014/0042396 A1* | 2/2014 | Yang | H01L 51/5281 257/40 |
| 2016/0118453 A1 | 4/2016 | Cho | |
| 2017/0184915 A1* | 6/2017 | Yang | G02F 1/136286 |
| 2017/0235196 A1* | 8/2017 | Lai | G02F 1/136209 349/46 |
| 2018/0150164 A1* | 5/2018 | Naganuma | G06F 3/0416 |
| 2018/0337365 A1* | 11/2018 | Harada | H01L 51/5253 |

FOREIGN PATENT DOCUMENTS

DE 10 2015 109475 A1 6/2016

* cited by examiner

*Primary Examiner* — Dennis P Joseph
(74) *Attorney, Agent, or Firm* — Seed IP Law Group LLP

(57) ABSTRACT

The present disclosure relates to an organic light-emitting display device capable of preventing threshold voltage variation in a thin film transistor. In the organic light-emitting display device according to the present disclosure, an upper light-shielding layer overlying a pixel driving circuit which drives a light-emitting element is disposed on the same plane as an anode electrode and a bank is disposed to cover the sides of the upper light-shielding layer, and thus light input to the sides and the upper surface of an active layer can be blocked.

10 Claims, 10 Drawing Sheets

ORGANIC LIGHT-EMITTING DISPLAY DEVICE

CROSS-REFERENCE TO RELATED APPLICATION(S)

This application claims the benefit of Korean Patent Application No. 2017-0163237, filed on Nov. 30, 2017, which is hereby incorporated by reference as if fully set forth herein.

BACKGROUND

Technical Field

The present disclosure relates to an organic light-emitting display device and, more particularly, to an organic light-emitting display device capable of preventing a threshold voltage of a thin film transistor from varying.

Description of the Related Art

Image display devices which realize various types of information as images are a core technology of the information communication society and are developed into thinner, lighter and more portable high-performance devices. An organic light-emitting diode (OLED) display device which displays an image by controlling the quantity of light emitted from an organic emission layer is spotlighted as a flat panel display capable of reducing weight and volume, which are shortcomings of a cathode ray tube (CRT). Such an OLED display device is a self-emissive display having low power consumption, a high response speed, high emission efficiency, a high luminance and a wide viewing angle.

Such an OLED display device displays an image through a plurality of sub-pixels arranged in a matrix. Here, each sub-pixel includes a light-emitting element and a pixel driving circuit for independently driving the light-emitting element.

Threshold values of a plurality of transistors included in the pixel driving circuit vary in a negative direction when the transistors are exposed to external light. Due to such threshold voltage variation, luminance of sub-pixels connected to transistors exposed to external light becomes higher than luminance of sub-pixels connected to transistors which are not exposed to the external light, resulting in non-uniform image display.

BRIEF SUMMARY

An embodiment of the present disclosure provides an organic light-emitting display device capable of preventing a threshold voltage of a thin film transistor from varying.

In an organic light-emitting display device according to embodiments of the present disclosure, an upper light-shielding layer overlying a pixel driving circuit which drives a light-emitting element and a bank is disposed to cover the sides of the upper light-shielding layer.

According to one embodiment of the present disclosure, the organic light-emitting display device includes the upper light-shielding layer is disposed on the same plane as the anode electrode and overlying on the pixel driving circuit. The upper light-shielding layer absorbs or reflects light input from outside or light generated from the light-emitting element and thus can block light input to the sides and the upper surface of an active layer. Accordingly, embodiments of the present disclosure can prevent threshold voltage variation in a transistor due to light to improve non-uniformity in image display caused by threshold voltage variation.

DETAILED DESCRIPTION

Embodiments of the present disclosure will be described in detail with reference to the attached drawings.

Figure 1:
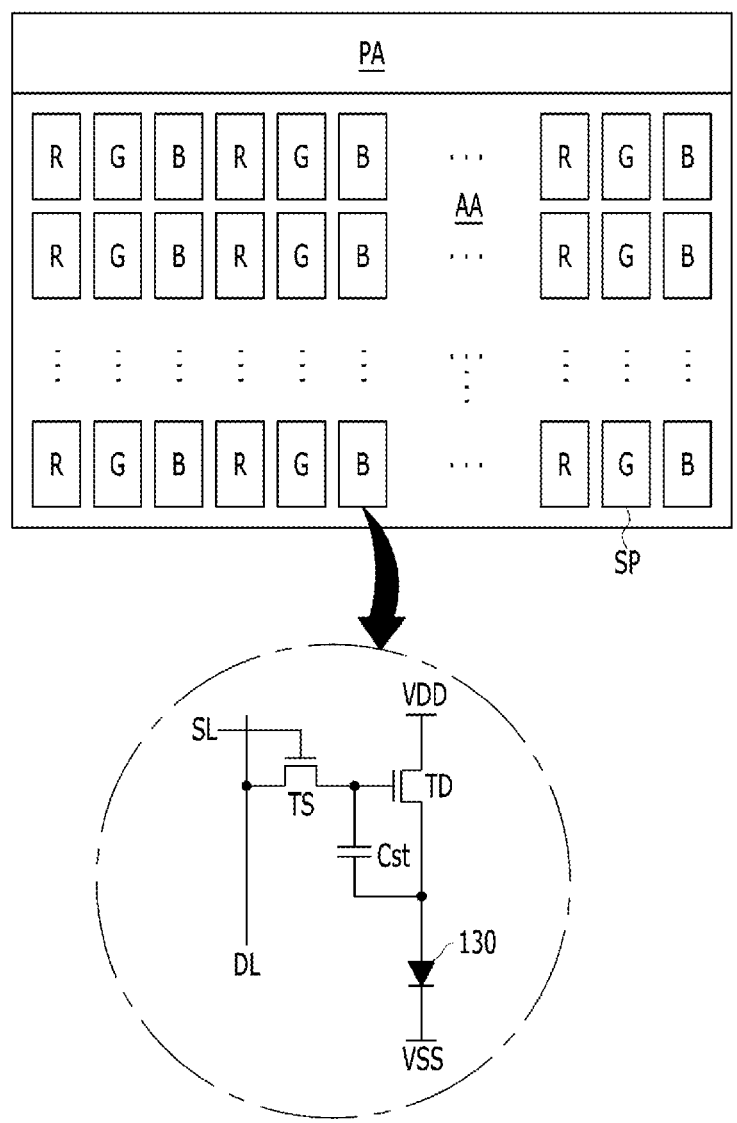
FIG. 1 is a plan view showing an organic light-emitting display device according to an embodiment of the present disclosure.

FIG. 1 is a plan view illustrating an organic light-emitting display device according to the present disclosure.

The organic light-emitting display device shown in FIG. 1 includes an active area AA and a pad area PA.

A plurality of pads through which driving signals are supplied to scan lines SL, data lines DL, a high voltage (VDD) supply line and a low voltage (VSS) supply line arranged in the active area AA is formed in the pad area PA.

Figure 2:
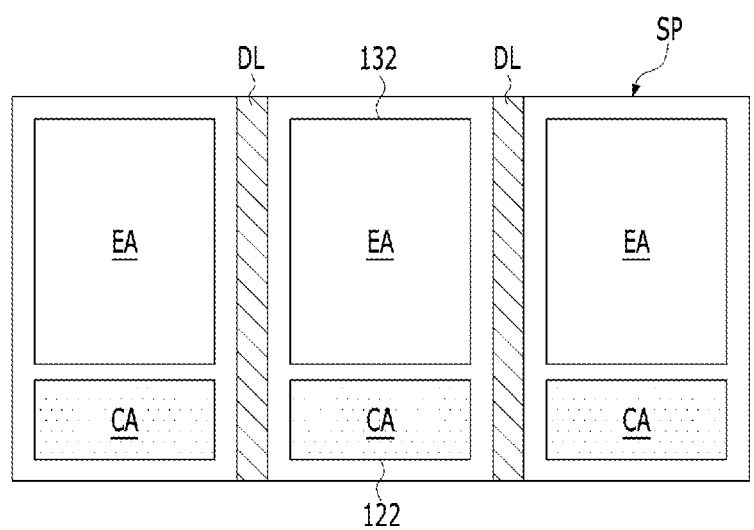
FIG. 2 is a plan view showing an emission area and a driving circuit area of each sub-pixel shown in FIG. 1 in more detail.

The active area AA displays an image through unit pixels including light-emitting elements 130. A unit pixel is composed of red (R), green (G) and blue (B) sub-pixels or red (R), green (G), blue (B) and white (W) sub-pixels. Each sub-pixel includes an emission element 130 and a pixel driving circuit for independently driving the emission element 130. Here, the emission element is disposed in an emission area of each sub-pixel and the pixel driving circuit is disposed in a driving circuit area of each sub-pixel, as shown in FIG. 2.

The pixel driving circuit includes a switching transistor TS, a driving transistor TD and a storage capacitor Cst.

The switching transistor TS turns on when a scan pulse signal is applied to the scan line SL to provide a data signal supplied to the data line to the storage capacitor Cst and the gate electrode of the driving transistor TD.

The driving transistor TD adjusts the quantity of emitted light of the light-emitting element 130 by controlling current I supplied from the high voltage (VDD) supply line to the light-emitting element 130 in response to a data signal supplied to the gate electrode of the driving transistor TD. In addition, even when the switching transistor TS turns off, the driving transistor TD supplies constant current I according to the voltage charged in the storage capacitor Cst until a data signal of the next frame is provided such that the light-emitting element 130 maintains light emission.

Figure 3:
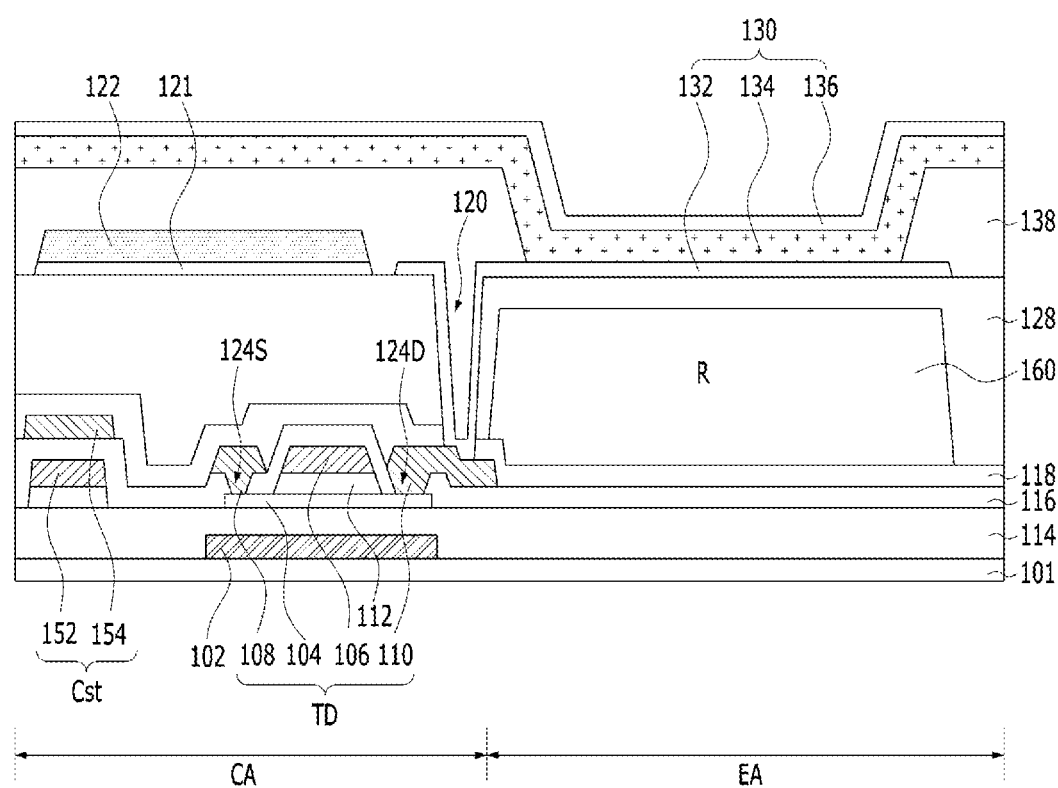
FIG. 3 is a cross-sectional view showing each sub-pixel of the organic light-emitting display device shown in FIG. 1.

To this end, the driving transistor TD includes the gate electrode 106, a source electrode 108, a drain electrode 110 and an active layer 104, as shown in FIG. 3.

The gate electrode 106 is formed on a gate insulating pattern 112 which is the same pattern as the gate electrode 106. The gate electrode 106 is superposed on a channel region of the active layer 104 having the gate insulating pattern 112 interposed therebetween. The gate electrode 106 may be a single layer or multiple layers formed of any one of Mo, Al, Cr, Au, Ti, Ni, Nd and Cu or an alloy thereof, but the present disclosure is not limited thereto. For example, the gate electrode 106 is formed in a Cu/MoTi structure.

The source electrode 108 is connected to the active layer 104 exposed through a source contact hole 124S penetrating an interlevel insulating layer 116. The drain electrode 110 is connected to the active layer 104 exposed through a drain contact hole 124D penetrating the interlevel insulating layer 116. In addition, the drain electrode 110 is exposed through a pixel contact hole 120 formed to penetrate a passivation layer 118 and a planarization layer 128 to be connected to an anode electrode 132.

For example, the source electrode 108 and the drain electrode 110 may be a single layer or multiple layers formed of any one of Mo, Al, Cr, Au, Ti, Ni, Nd and Cu or an alloy thereof, but the present disclosure is not limited thereto.

The active layer 104 on which the gate electrode 106 is superposed having the gate insulating pattern 112 formed therebetween includes the channel region formed between the source electrode 108 and the drain electrode 110. The active layer 104 is formed on a buffer layer 114 using at least one of an amorphous semiconductor material, a polysilicon semiconductor material and an oxide semiconductor material. The buffer layer 114 is formed of silicon oxide or silicon nitride in a monolayer or multilayer structure on a substrate 101 formed of a plastic resin such as glass or polyimide (PI). The buffer layer 114 serves to aid in crystallization of the active layer 104 by preventing diffusion of moisture or impurities generated in the substrate 101 or controlling a heat transfer rate during crystallization.

The storage capacitor Cst is formed by superposing a storage upper electrode 154 on a storage lower electrode 152 having an interlevel insulating layer 116 formed therebetween. The storage lower electrode 152 is formed of the same material as the gate electrode 106 on the same plane on which the gate electrode 106 is formed, and the storage upper electrode 154 is formed of the same material as the drain electrode 110 on the same plane on which the drain electrode 110 is formed. The storage lower electrode 152 is connected to the drain electrode 110 of one of the switching transistor TS and the driving transistor TD and the storage upper electrode 154 is connected to the drain electrode 110 of the other one of the switching transistor TS and the driving transistor TD. Even when the switching transistor TS is turned off by a voltage charged in the storage capacitor Cst, the driving transistor TD supplies constant current until a data signal of the next frame is provided to maintain light emission from the light-emitting element 130.

The light-emitting element 130 includes the anode electrode 132 connected to the drain electrode 110 of the driving transistor TD, at least one organic layer 134 formed on the anode electrode 132, and a cathode electrode 136 formed on the organic layer 134 to be connected to the low voltage (VSS) supply line. Here, the low voltage (VSS) supply line serves to provide the low voltage VSS lower than the high voltage VDD.

The anode electrode 132 is formed of a transparent conductive layer such as indium-tin-oxide (ITO) or indium-zinc-oxide (IZO) when applied to a bottom emission type organic light-emitting display device. The upper surface of the anode electrode 132 is exposed by a bank layer or bank 138 to provide an emission area. That is, the bank 138 is formed to cover the edge of the anode electrode 132 along the edge of the anode electrode 132 excluding the emission area EA. Further, the bank 138 is formed to cover the driving circuit area CA and thus covers the surface and sides of an upper light-shielding layer 122 formed in the driving circuit area CA. The bank 138 can prevent the sides of the upper light-shielding layer 122 from contacting the organic layer 134.

The organic layer 134 is formed by forming a hole transport layer, an emission layer and an electron transport layer sequentially or in reverse order.

The cathode electrode 136 is formed on the organic layer 134 and the bank 138 to face the anode electrode 132 having the organic layer 134 disposed therebetween. The cathode electrode 136 is formed in a multilayer structure including a transparent conductive layer and an opaque conductive layer having high reflection efficiency when applied to a bottom emission type organic light-emitting display device. The transparent conductive layer is formed of a material having a relatively large work function value, such as indium-tin-oxide (ITO) or indium-zinc-oxide (IZO) and the opaque conductive layer is formed in a monolayer or multilayer structure including Al, Ag, Cu, Pb, Mo, Ti or an alloy thereof. For example, the cathode electrode 136 is formed in a structure in which a transparent conductive layer, an opaque conductive layer and a transparent conductive layer are sequentially laminated.

Color filters 160 are disposed on the passivation layer 118 to be overlying on the emission areas EA provided by the bank 138. One of red (R), green (G) and blue (B) color filters is disposed in each sub-pixel. That is, a red color filter 160 is disposed in a red (R) sub-pixel, a green color filter 160 is disposed in a green (G) sub-pixel, and a blue color filter 160 is disposed in a blue (B) sub-pixel. Accordingly, when white light generated from the organic layer 130 passes through a certain color filter 160, the color filter 160 realizes light in the color corresponding thereto. Each color filter 160 may be extended to cover at least one of the switching transistor TS and the driving transistor TD.

As described above, when the organic layer 134 generates white light, the white light generated from the organic layer 134 is input to the color filter 160 to realize a color image. On the other hand, the organic layer 1343 may generate color light corresponding to each sub-pixel SP to realize a color image without the color filter 160. That is, the organic layer 134 of the red (R) sub-pixel SP may generate red light, the organic layer 134 of the green (G) sub-pixel SP may generate green light, and the organic layer 134 of the blue (B) sub-pixel SP may generate blue light.

The planarization layer 128 is formed of a transparent organic insulating material such as acrylic resin on the substrate 101 on which the color filter 160 is formed for planarization. The planarization layer 128 serves as a white color filter in white sub-pixels SP without having the color filter 160.

As described above, the present disclosure includes a lower light-shielding layer 102 and the upper light-shielding layer 122 in order to prevent external light from being input to the driving transistor TD and the switching transistor TS.

The lower light-shielding layer 102 is disposed between the substrate 101 and the active layer 104. That is, the lower light-shielding layer 102 is formed on the substrate 101 such that the active layer 104 is overlapping it. The lower light-shielding layer 102 absorbs or reflects external light and thus can block external light input to the sides and bottom of the active layer 104. The lower light-shielding layer 102 is formed of an opaque metal such as Mo, Ti, Al, Cu, Cr, Co, W, Ta or Ni.

The upper light-shielding layer 122 is disposed on the planarization layer 128 to be overlying the pixel driving circuit of each sub-pixel SP including the switching transistor TS, the driving transistor TD and the storage capacitor Cst. That is, the upper light-shielding layer 122 is disposed in the driving circuit area CA of each sub-pixel SP. A transparent conductive layer 121 is formed between the upper light-shielding layer 122 and the planarization layer 128.

Figure 4:
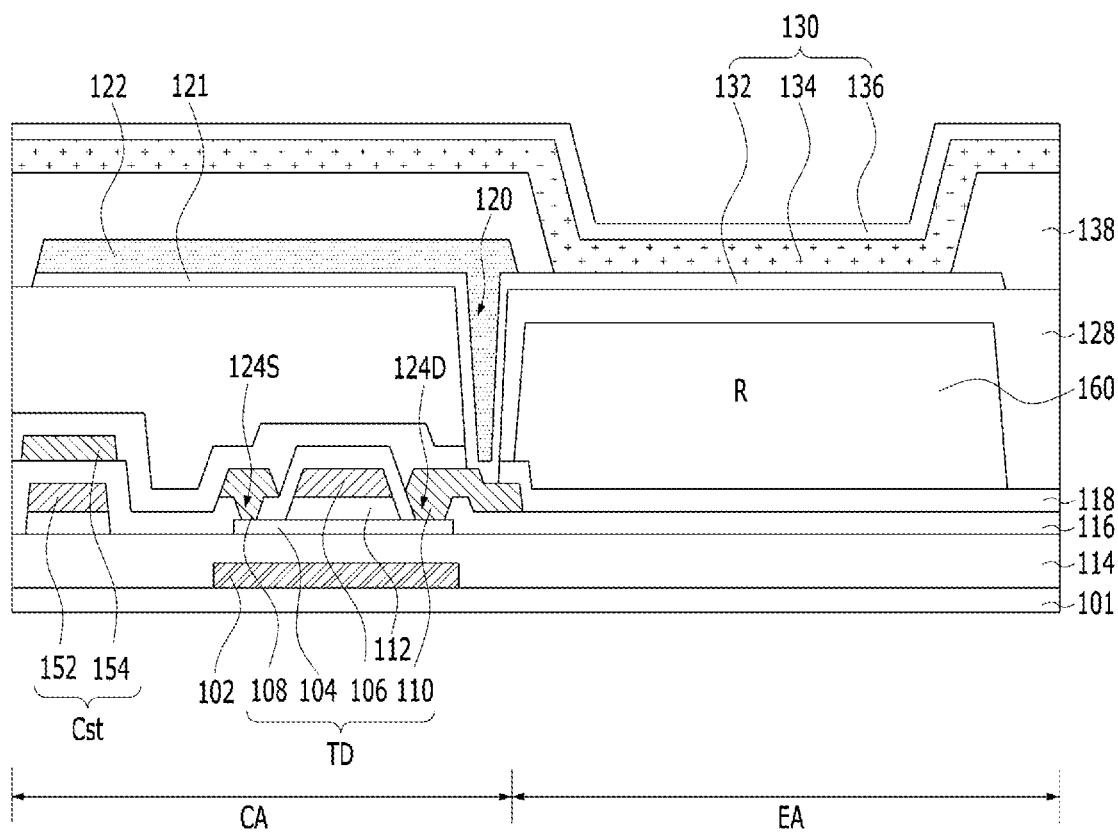
FIG. 4 is a cross-sectional view showing an upper light-shielding layer shown in FIG. 3 according to another embodiment.

The transparent conductive layer 121 is disposed to directly come into contact with the upper light-shielding layer under the upper light-shielding layer 122. The transparent conductive layer 121 is formed of the same material as the anode electrode 132 on the same plane in which the anode electrode 132 is formed. That is, the transparent conductive layer 121 is formed of a transparent material such as ITO or IZO. The transparent conductive layer 121 is electrically isolated from the anode electrode 132, as shown in FIG. 3, or electrically connected to the anode electrode 132, as shown in FIG. 4. When the anode electrode 132 is electrically isolated from the transparent conductive layer 121, as shown in FIG. 3, it is possible to prevent parasitic capacitors from being formed between the upper light-shielding layer 122 and the electrodes included in the driving transistor TD, the storage capacitor Cst and the switching transistor TS. When the anode electrode 132 is electrically connected to the transparent conductive layer 121, as shown in FIG. 4, the upper light-shielding layer 122 disposed on the transparent conductive layer 121 can be extended to the pixel contact hole 120 and thus can effectively block light input to the active layer 104.

The upper light-shielding layer 122 is formed on the transparent conductive layer 121 using a material identical or similar to that of the lower light-shielding layer 102. That is, the upper light-shielding layer 122 is formed of an opaque metal such as Mo, Ti, Al, Cu, Cr, Co, W, Ta or Ni. The upper light-shielding layer 122 is formed in the same line width as the transparent conductive layer 121 such that the upper light-shielding layer 122 is not overlying the drain electrode 110 of the driving transistor TD, as shown in FIG. 3. Or, in one embodiment it is formed to be fully overlying the drain electrode 110 of the driving transistor TD as well as the entire driving circuit area CA, as shown in FIG. 4.

The upper light-shielding layer 122 absorbs or reflects light input from outside or internal light generated in the light-emitting element and input to the active layer 104 and thus can block light input to the sides and upper surface of the active layer 104.

Figure 5:
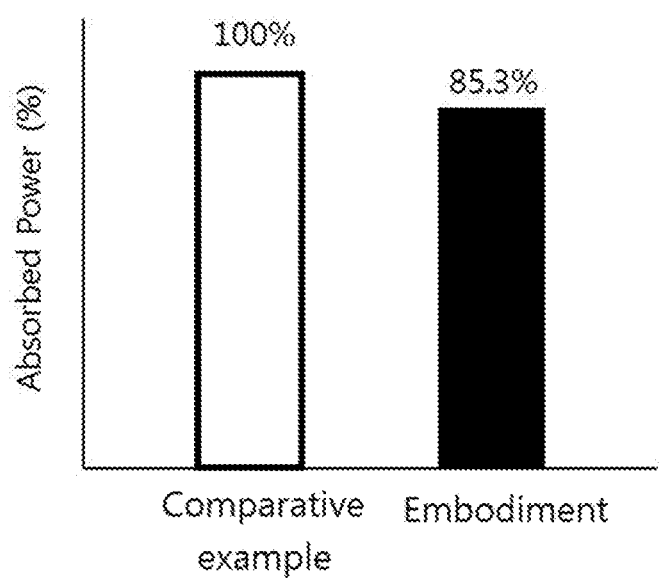
FIG. 5 is a diagram for describing the quantity of light input to an active layer in a comparative example in which an upper light-shielding layer is not provided and an embodiment in which an upper light-shielding layer is provided.

Accordingly, in the embodiment of the present disclosure including the upper light-shielding layer 122, the quantity of light input to the active layer can be reduced more than in a comparative example in which the upper light-shielding layer is not provided, as shown in FIG. 5.

In this case, in the comparative example in which the upper light-shielding layer is not provided, a threshold voltage is shifted in a negative direction due to negative bias illumination stress (NBiS) as time for which the active layer is exposed to external light increases. On the other hand, in the embodiment in which the upper light-shielding layer 122 is provided, NBiS can be reduced by the upper light-shielding layer 122 even if time when the active layer is exposed to external light increases, and thus threshold voltage variation can be prevented. Accordingly, the present disclosure can improve non-uniformity in image display caused by threshold voltage variation.

FIGS. 6A to 6E are cross-sectional views for describing a method of manufacturing the organic light-emitting display device shown in FIG. 3.

Figure 6A:
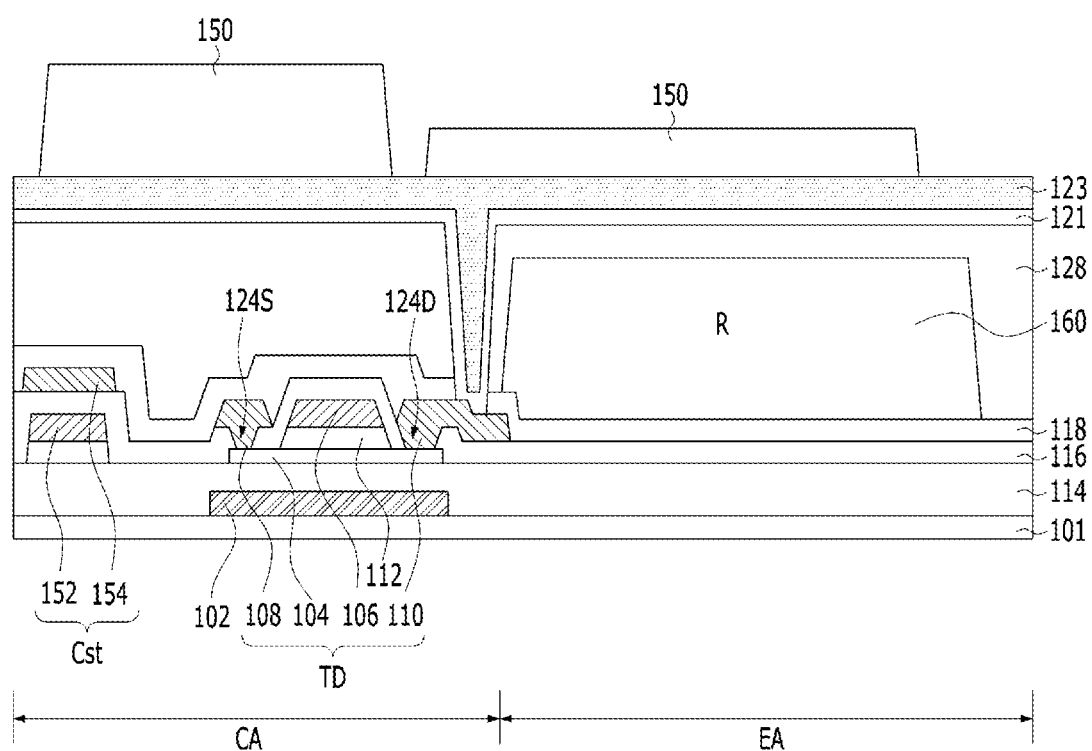
FIGS. 6A to 6E are cross-sectional views for describing a method of manufacturing the organic light-emitting display device shown in FIG. 3.
Figure 6B:
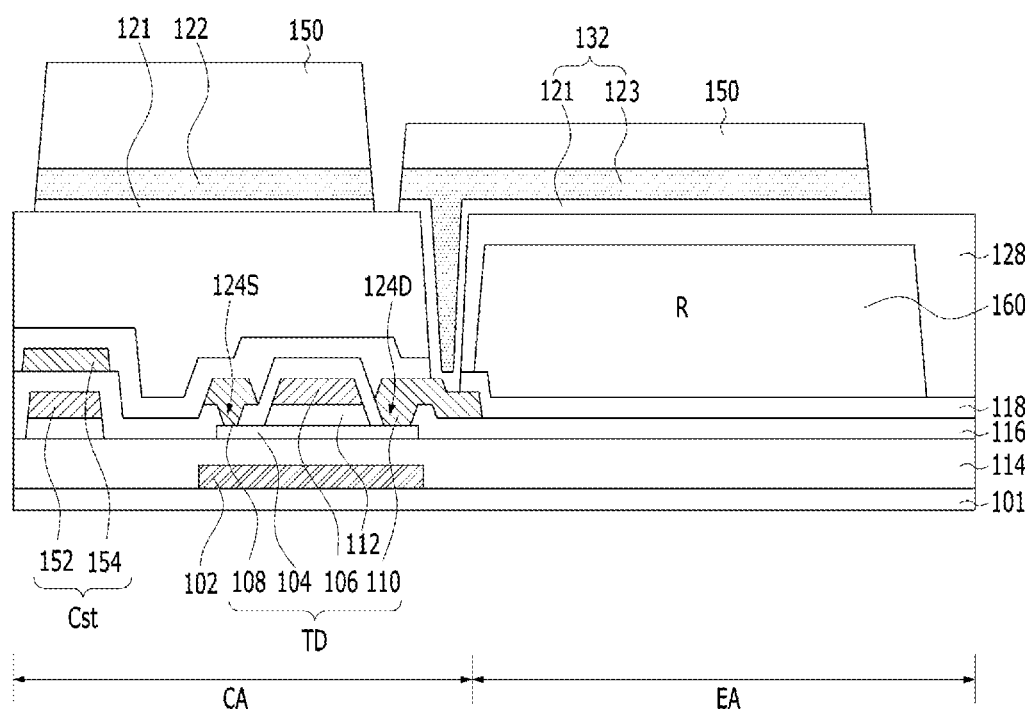

As shown in FIG. 6A, the storage capacitor Cst, the driving transistor TD, the color filters 160 and the planarization layer 128 are formed on the substrate 101 through multiple mask processes. Then, the transparent conductive layer 121 and an opaque conductive layer 123 are sequentially formed on the substrate 101 on which the planarization layer 128 is formed. Subsequently, photoresist is coated on the overall surface of the opaque conductive layer 123 and patterned through a photolithography process to form a photoresist pattern 150 in a multilevel structure. The photoresist pattern 150 is formed to a first thickness in the emission area and to a second thickness greater than the first thickness in the driving circuit area CA. The transparent conductive layer 121 and the opaque conductive layer 123 are patterned through an etching process using the photoresist pattern 150 as a mask to form the upper light-shielding layer 122 and the anode electrode 132, as shown in FIG. 6B.

Here, the transparent conductive layer 121 is disposed under the upper light-shielding layer 122 and the anode electrode 132 is formed in a structure in which the transparent conductive layer 121 and the opaque conductive layer 123 are sequentially laminated.

Figure 6C:
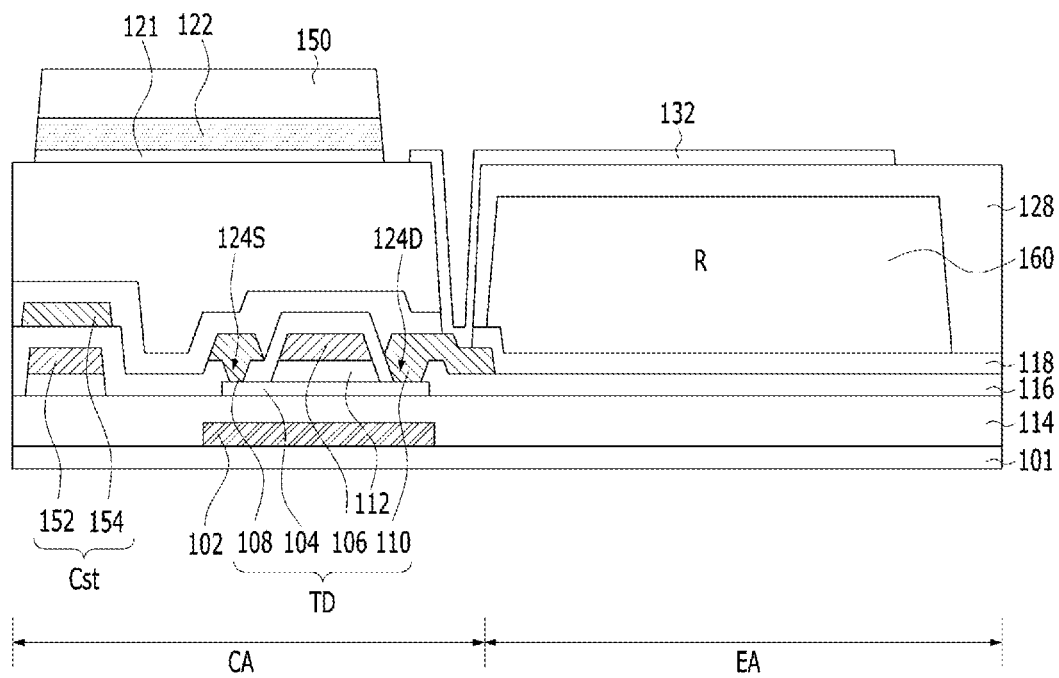
Figure 6D:
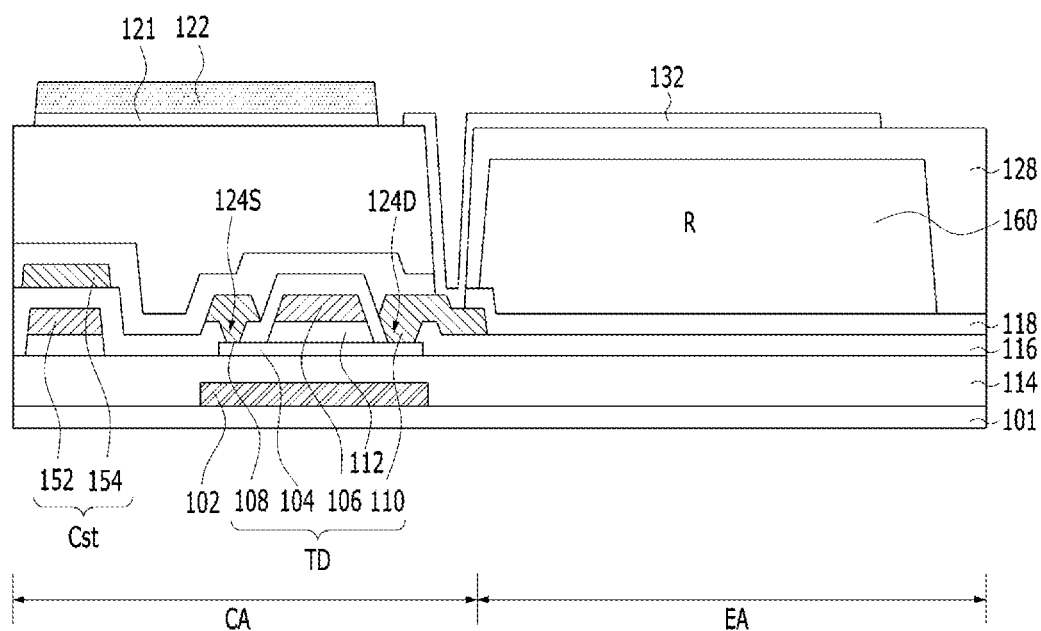
Figure 6E:
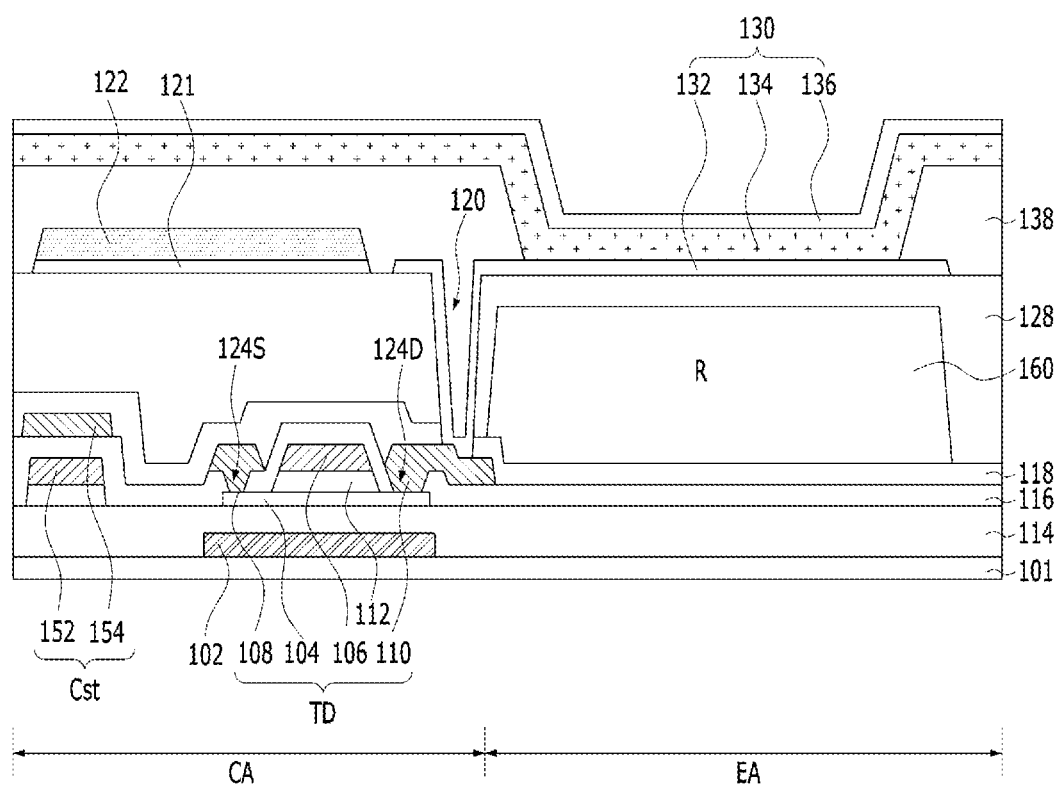

Then, an ashing process is performed to remove the photoresist pattern 150 having the first thickness to expose the opaque conductive layer 123 included in the anode electrode 132, as shown in FIG. 6C. The thickness of the photoresist pattern 150 having the second thickness is decreased through the ashing process and the remaining photoresist pattern 150 having the second thickness covers the upper light-shielding layer 122. The exposed opaque conductive layer 123 of the anode electrode 132 is removed through an etching process using the photoresist pattern 150 having the second thickness as a mask. Accordingly, the anode electrode 132 is composed of the transparent conductive layer 121, as shown in FIG. 6D.

Subsequently, an organic layer is formed of photoacrylic resin, for example, on the overall surface of the substrate 101 on which the upper light-shielding layer 122 and the anode electrode 132 are formed and then patterned through photolithography to form the bank 138, as shown in FIG. 7E. Thereafter, the organic layer 134 is formed on the overall surface of the substrate 101 on which the bank 138 is formed and the cathode electrode 136 is formed on the substrate 101 on which the organic layer 134 is formed.

Figure 7:
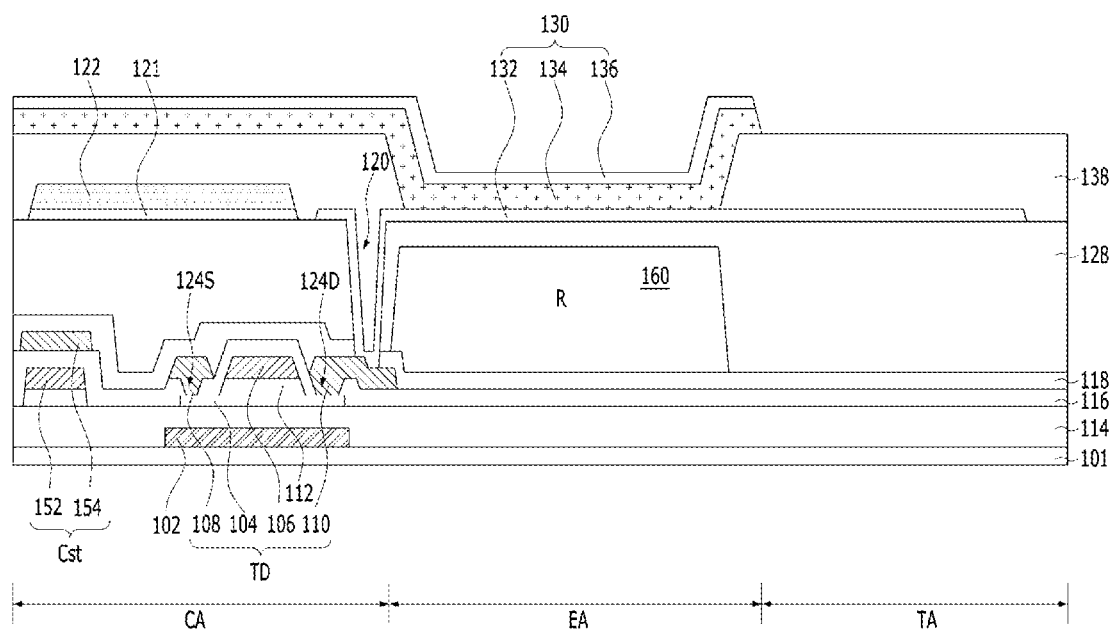
FIG. 7 is a cross-sectional view showing an organic light-emitting display device according to another embodiment of the present disclosure.

FIG. 7 is a cross-sectional view showing an organic light-emitting display device according to a second embodiment of the present disclosure.

The organic light-emitting display device shown in FIG. 7 includes the same components as those of the organic light-emitting display device shown in FIGS. 3 and 4 except that each sub-pixel SP further includes a transmission area TA. Accordingly, detailed description of the same components is omitted.

The transmission area TA shown in FIG. 8 is an area in which light input through the rear side of the organic light-emitting display device passes such that a background image of an object or a scene behind the organic light-emitting display device can be seen. That is, the transmission area TA transmits light input to the front side of the cathode electrode 136 when the organic light-emitting display device is a bottom emission type and transmits light input to the rear side of the substrate 101 when the organic light-emitting display device is a top emission type.

To this end, only thin films formed of transparent materials are disposed in the transmission area TA. The substrate 101, the buffer layer 114, the interlevel insulating layer 116, the passivation layer 118, the planarization layer 128, the anode electrode 132 and the bank 138 are disposed in the transmission area TA. The upper light-shielding layer 122, which is a thin film formed of an opaque material, is not disposed under the bank 138 formed in the transmission area TA, and thus a transparent display device can be realized.

Such a transparent display device includes the upper light-shielding layer 122 disposed on the planarization layer 128 to be overlying the pixel driving circuit. The upper light-shielding layer 122 absorbs or reflects light input from outside or light generated from the light-emitting element and thus can block light input to the sides and upper surface of the active layer 104. Accordingly, the present disclosure can prevent threshold voltage variation in a transistor due to light to improve non-uniformity in image display caused by threshold voltage variation.

Those skilled in the art will appreciate that the present disclosure may be carried out in other specific ways than those set forth herein without departing from the spirit and essential characteristics of the present disclosure. The above embodiments are therefore to be construed in all aspects as illustrative and not restrictive. The scope of the disclosure should be determined by the appended claims and their legal equivalents, not by the above description, and all changes coming within the meaning and equivalency range of the appended claims are intended to be embraced therein.

The various embodiments described above can be combined to provide further embodiments. These and other changes can be made to the embodiments in light of the above-detailed description. In general, in the following claims, the terms used should not be construed to limit the claims to the specific embodiments disclosed in the specification and the claims, but should be construed to include all possible embodiments along with the full scope of equivalents to which such claims are entitled. Accordingly, the claims are not limited by the disclosure.

The invention claimed is:

1. An organic light-emitting display device, comprising:
light-emitting elements disposed on a substrate, each light-emitting element including an anode electrode;
pixel driving circuits, each pixel driving circuit connected to a corresponding light-emitting element of the light-emitting elements;
an upper light-shielding layer overlying the pixel driving circuits, the upper light-shielding layer including sides;
a bank layer providing emission areas in which the light-emitting elements are arranged, and the bank layer disposed to cover the sides of the upper light-shielding layer; and
a transparent conductive layer that is overlapping with the upper light-shielding layer and is non-overlapping with the anode electrode,
wherein an area of the upper light-shielding layer is smaller than an area of the anode electrode,
wherein the transparent conductive layer is disposed under the upper light-shielding layer, the transparent conductive layer being formed of a same material as the anode electrode, the transparent conductive layer is electrically connected to the anode electrode,
wherein the upper light-shielding layer is formed of an opaque conductive layer disposed on the transparent conductive layer, the upper light-shielding layer in contact with the transparent conductive layer,
wherein the bank layer is disposed overlaid in a pixel contact hole that the sides of the upper light-shielding layer are separated from an organic layer, and
wherein each pixel driving circuit includes a driving transistor connected to the corresponding light-emitting element, and the upper light-shielding layer is disposed on a drain electrode of the driving transistor in the pixel contact hole.

2. The organic light-emitting display device according to claim 1, wherein the transparent conductive layer and the anode electrode are disposed on a planarization layer.

3. The organic light-emitting display device according to claim 1, wherein the anode electrode is disposed in one of the emission areas, and the anode electrode contacts with the drain electrode in a boundary area of a driving circuit area and the one of the emission areas, and
the anode electrode extends to the driving circuit area to form the transparent conductive layer.

4. The organic light-emitting display device according to claim 1, further comprising a plurality of sub-pixels, wherein each sub-pixel of the plurality of sub-pixels corresponds to a respective emission area of the emission areas in which the corresponding light-emitting element is arranged, wherein each sub-pixel further includes a transmission area, and wherein thin films formed of transparent materials are disposed between the bank layer and a portion of the substrate corresponding to a transparent area.

5. The organic light-emitting display device according to claim 1, wherein each pixel driving circuit includes a storage capacitor connected to the driving transistor, and
wherein the upper light-shielding layer is overlying the storage capacitor.

6. An organic light-emitting display device comprising:
a substrate having an emission area and a driving circuit area;
at least one light emitting element disposed at the emission area, each light-emitting element having an anode electrode;
at least one transistor element disposed at the driving circuit area, the at least one transistor element being connected with the at least one light emitting element;
an upper light-shielding layer overlying the least one transistor element, the upper light-shielding layer including sides;
a bank layer providing the emission area in which the at least one light-emitting elements is arranged, and the bank layer disposed to cover the sides of the upper light-shielding layer; and
a transparent conductive layer that is overlapping with the upper light-shielding layer and is non-overlapping with the anode electrode,
wherein an area of the upper light-shielding layer is smaller than an area of the anode electrode,
wherein the transparent conductive layer is disposed under the upper light-shielding layer, the transparent conductive layer being formed of a same material as the anode electrode, the transparent conductive layer is electrically connected to the anode electrode,
wherein the upper light-shielding layer is formed of an opaque conductive layer disposed on the transparent conductive layer, the upper light-shielding layer being in contact with the transparent conductive layer, wherein the bank layer is disposed overlaid in a pixel contact hole that the sides of the upper light-shielding layer are separated from an organic layer, and wherein each of the least one transistor element includes a driving transistor connected to a respective light-emitting element of the least one light-emitting element, the upper light-shielding layer is disposed on a drain electrode of the driving transistor in the pixel contact hole.

7. The organic light-emitting display device according to claim 6, wherein the transparent conductive layer and anode electrode are disposed on a planarization layer.

8. The organic light-emitting display device according to claim 6, wherein the at least one transistor element includes a switching transistor.

9. The organic light-emitting display device according to claim 6, wherein the light emitting area further includes a transmission area, and thin films formed of transparent materials are disposed at an area between the bank layer and a portion of the substrate corresponding to the transmission area.

10. The organic light-emitting display device according to claim 6, further comprising a storage capacitor disposed in the driving circuit area, and wherein the upper light-shielding layer is on the storage capacitor.

\* \* \* \* \*